United States Patent [19]

Wanninger

[11] Patent Number: 4,745,369
[45] Date of Patent: May 17, 1988

[54] CIRCUIT ARRANGEMENT FOR PROTECTION AGAINST THERMAL OVERLOAD OF TRAVELING WAVE TUBE AMPLIFIERS HAVING MULTICOLLECTOR TRAVELING WAVE TUBES

[75] Inventor: Ludwig Wanninger, Neubiberg, Fed. Rep. of Germany

[73] Assignee: Siemens Aktiengesellschaft, Berlin and Munich, Fed. Rep. of Germany

[21] Appl. No.: 931,629

[22] Filed: Nov. 17, 1986

[30] Foreign Application Priority Data

Mar. 27, 1986 [DE] Fed. Rep. of Germany ....... 3610524

[51] Int. Cl.$^4$ .............................................. H03F 3/58
[52] U.S. Cl. ................................... 330/43; 330/207 P
[58] Field of Search ................ 330/43, 207 P; 331/82; 361/87; 328/8, 9, 10; 315/3.5, 3.6

[56] References Cited

U.S. PATENT DOCUMENTS 3,890,545  6/1975  Rosen ............................. 330/43 X

OTHER PUBLICATIONS

Scerch, "High Power Solid State Modulator for Coherent Agile Microwave Amplifier", 11th Modulator Symposium, New York, USA, 18-19, Sep. 1973, pp. 84-88.

Primary Examiner—James B. Mullins
Attorney, Agent, or Firm—Hill, Van Santen, Steadman & Simpson

[57] ABSTRACT

A circuit arrangement protects against thermal overload as a consequence of impermissible operating conditions in traveling wave tube amplifiers having multi-collector traveling wave tubes. At least one measuring device is provided for measuring the collector current at at least one collector of the traveling wave tube and, in response to measuring a prescribed current threshold, the cathode current of the traveling wave tube is regulated back by way of a control device or is disconnected by way of a control logic circuit.

3 Claims, 3 Drawing Sheets

CIRCUIT ARRANGEMENT FOR PROTECTION AGAINST THERMAL OVERLOAD OF TRAVELING WAVE TUBE AMPLIFIERS HAVING MULTICOLLECTOR TRAVELING WAVE TUBES

BACKGROUND OF THE INVENTION

1. Field of the Invention

The present invention relates to a circuit arrangement for protection against thermal overload as a consequence of impermissible operating conditions in traveling wave tube amplifiers having multicollector traveling wave tubes.

2. Description of the Prior Art

The expansion of the type spectrum of integrated traveling wave tubes, particularly in the frequency range from 3.6 through 13.5 GHz, and the demand for tubes or, respectively, amplifiers having the highest possible linearity which are particularly suited for modern radio link transmission methods led to the development of a new generation of traveling wave tubes amplifiers. However, problems particularly in view of the occurrence of excessively high stray powers in the saturation range of the tubes or, respectively, amplifiers arose as, therefore did a thermal overload connected therewith when the traveling wave tube amplifers were operated in a faulty manner due to external influences, for example due to radio frequency overdriving at the tube input.

SUMMARY OF THE INVENTION

The object of the present invention is to avoid the aforementioned disadvantages and to provide a circuit arrangement which offers an effective protection against thermal overload as a consequence of impermissible operating conditions, in particular, by limitation or brief interruption of the power consumption of the traveling wave tube amplifier.

The above object is achieved, according to the present invention, in that at least one measuring device is provided for measuring the current in at least one collector of the traveling wave tubes, and in that, after a prescribed threshold of the measured current has been reached, the cathode current of the traveling wave tube is regulated back by way of a control device or is disconnected via a control logic circuit.

According to an advantageous feature of the invention, either the entire supply voltage for the traveling wave tube or only the control voltage is disconnected with the control logic circuit.

The advantage is achieved with the present invention or particularly comprised in that an effective protection against thermal overload as a consequence of impermissible or, respectively, disturbed or faulty operating conditions in traveling wave tube amplifiers having multicollector traveling wave tubes is achieved. This can be achieved, first of all, in that the power consumption of the traveling wave tube amplifier is limited while maintaining operations when operated in a faulty manner to external influences, for example due to RF overdriving at the tube input. On the other hand, either the entire supply for the traveling wave tube or only the control voltage can be disconnected by way of the control logic circuit, i.e. the operation of the tube is briefly interrupted, the interruption indicated as a thermal overload and, therefore, destruction of the traveling wave tube amplifier having a multi-collector traveling wave tube is avoided in this manner.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
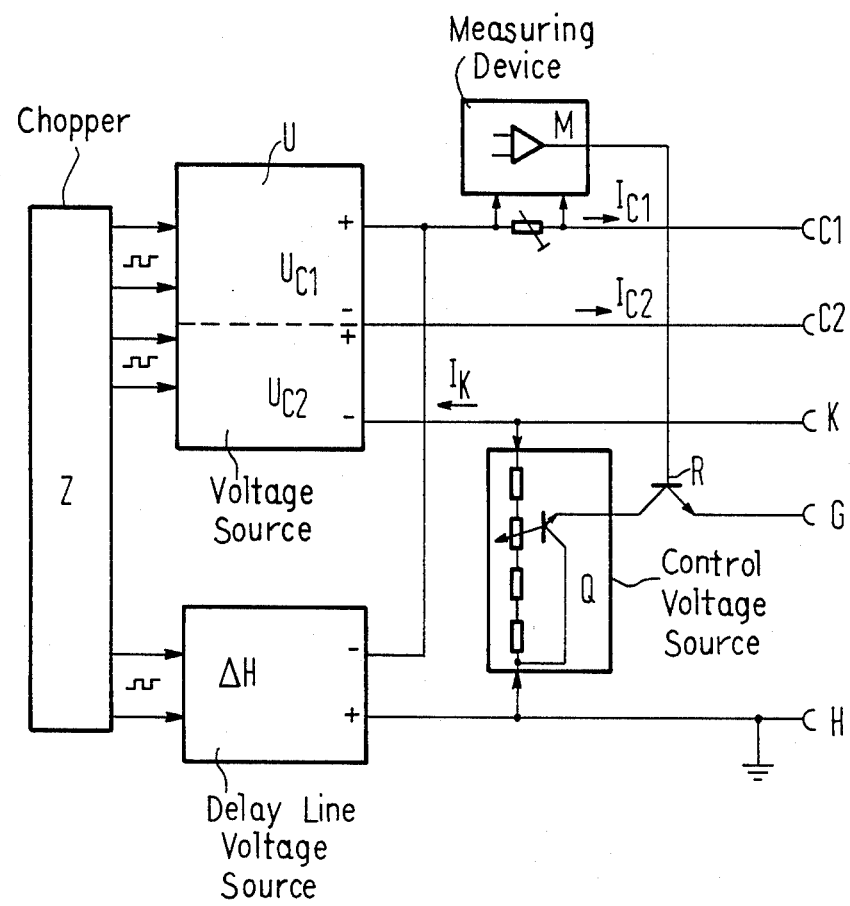
FIG. 1 is a block circuit diagram of a circuit arrangement constructed in accordance with the present invention for limiting the power consumption.
Figure 2:
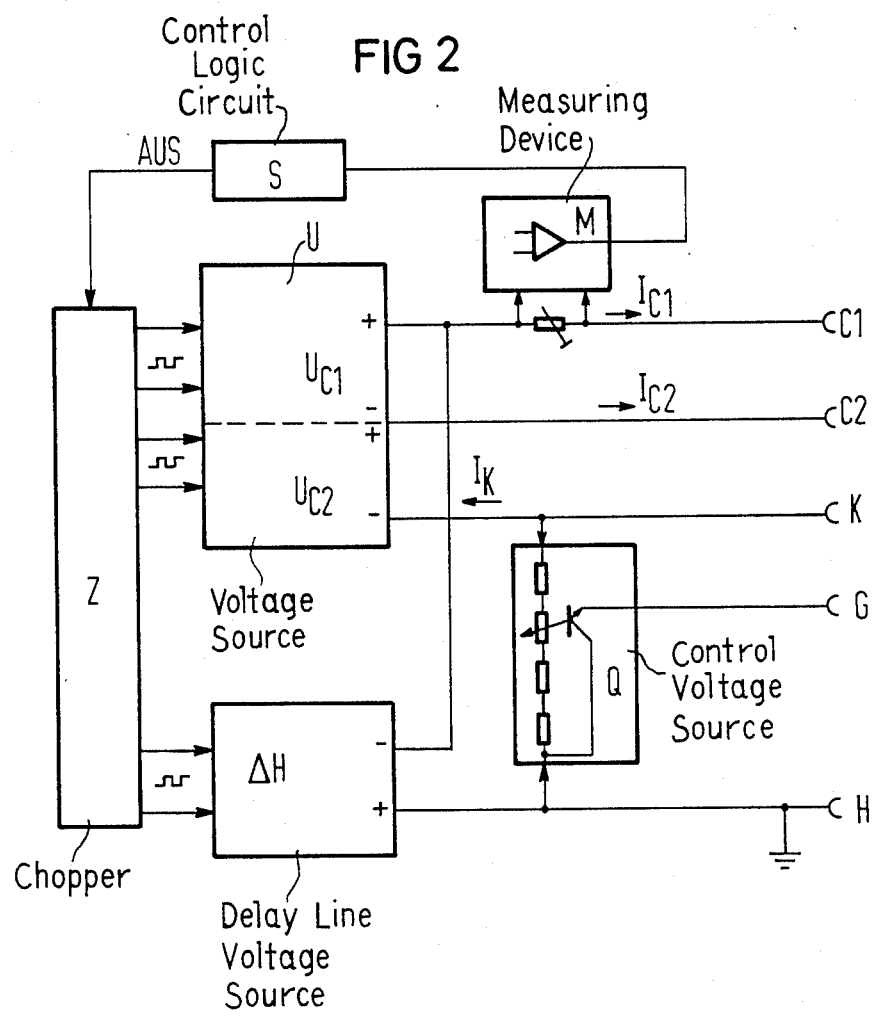
FIG. 2 is a block circuit diagram of a circuit arrangement constructed in accordance with the invention for disconnecting the supply voltage.
Figure 3:
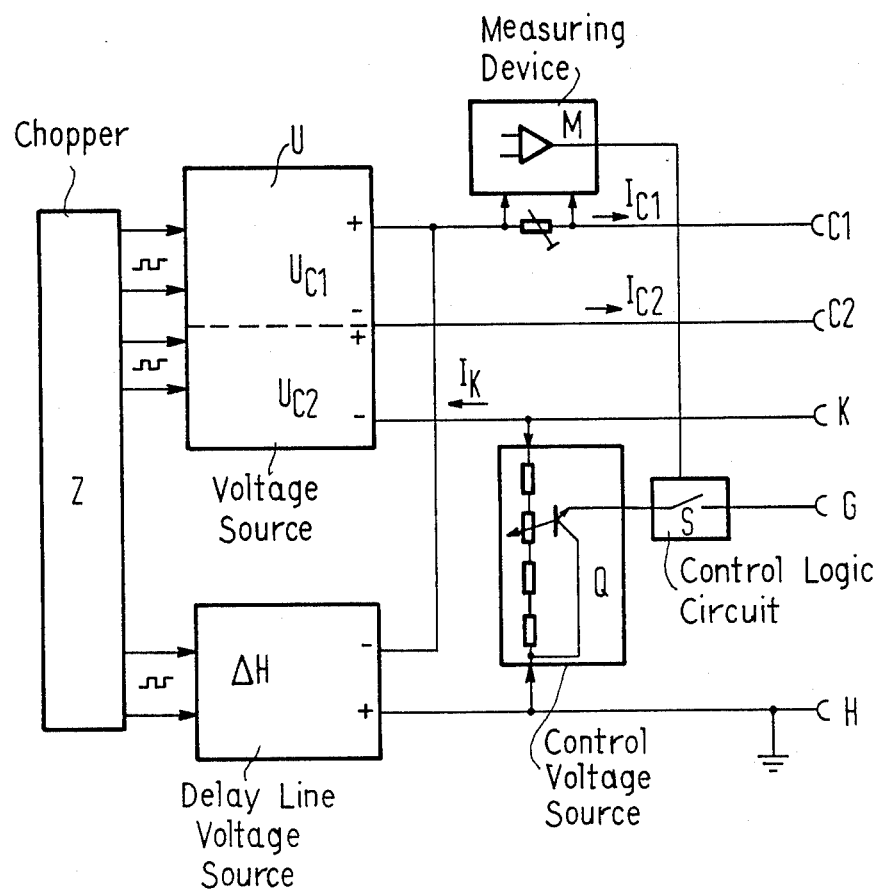
FIG. 3 is a block circuit diagram of a circuit arrangement constructed in accordance with the invention for disconnecting the control voltage.

The circuit arrangements illustrated in FIGS. 1–3 essentially comprise a measuring device M for measuring the current in the collector C1 of a traveling wave tube having two collectors C1 and C2. The terminal C1 is the input to the first collector, the terminal C2 is the input to the second collector, the terminal K is the input to the cathode, and the terminal H is the input to the delay line of the traveling wave tube. A chopper Z supplies a rectangular alternating voltage $U_{C1}$ and a rectangular alternating voltage $U_{C2}$ to a voltage source U. The voltages are rectified and filtered in the voltage source U to become sub-voltages $U_{C1}$ and $U_{C2}$. The chopper Z also serves the purpose of supplying the partial delay line voltage source $\Delta H$. The overall helix voltage, i.e. voltage between the cathode and the helix of the traveling wave tube, is generated from a d.c. oriented series connection of UC1, UC2 and $\Delta H$. The control voltage is generated in the control voltage source Q which comprises a high-voltage divider having a following current amplifier. A control voltage can be continuously set in the voltage ranges required by the traveling wave tubes.

A comparison between the reference and the actual value occurs in the device M, for example in an operational amplifier. After a prescribed threshold of the measured current $I_{C1}$ has been reached, the cathode current $I_K$ of the traveling wave tube is regulated back by way of a control device R which contains a control element.

In the exemplary embodiment of FIG. 2, a control logic circuit S is provided instead of the control device R. When a prescribed threshold of the current measured in the measuring device M is reached, the overall supply voltage for the traveling wave tube is switched to "OFF", i.e. is switched off via the control logic circuit S connected between the chopper Z and the measuring device M.

In the exemplary embodiment of FIG. 3, a control logic circuit S is again provided instead of the control device R, the control logic circuit S, however, being connected between the measuring device M and the control input to the control electrode G. When a threshold prescribed in the measuring device M is reached, or, respectively, exceeded, the control voltage is briefly disconnected via the control logic circuit S, and, therefore, the traveling wave tube amplifier is protected against thermal overload.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A circuit arrangement for protecting against thermal overload in a traveling wave tube amplifier which includes power supply connected to a multicollector traveling wave tube which comprises a delay line, at least first and second collectors, a cathode and a control electrode, a first collector terminal, a second collector terminal, a cathode terminal and a delay line terminal, comprising: a measuring device connected to at least one of the collector terminals for measuring alternating and direct collector current; and regulating means connected to the control electrode and to the cathode terminal and connected to and controlled by said measuring device to decrease the cathode current in response to measuring a predetermined collector current.

2. A circuit arrangement for protecting against thermal overload in a traveling wave tube amplifier which includes a power supply connected to a multicollector traveling wave tube which comprises a delay line, at least first and second collectors, a cathode and a control electrode, a first collector terminal, a second collector terminal, a cathode terminal and a delay line terminal, comprising:

a measuring device connected to at least one of the collector terminals for measuring alternating and direct collector current; and means connected to the power supply and connected to and controlled by said measuring device to disconnect the power supply in response to measuring a predetermined collector current.

3. A circuit arrangement for protecting against thermal overload in a traveling wave tube amplifier which includes a power supply connected to a multicollector traveling wave tube which comprises a delay line, at least first and second collectors, a cathode and a control electrode, a first collector terminal, a second collector terminal, a cathode terminal and a delay line terminal, comprising: a measuring device connected to at least one of the collector terminals for measuring alternating and direct collector current; and means connected to the control electrode and connected to and controlled by said measuring device to disconnect the control electrode terminal in response to measuring a predetermined collector current.

\* \* \* \* \*